(12) United States Patent
Ledentsov et al.

(10) Patent No.: US 10,651,628 B2
(45) Date of Patent: May 12, 2020

(54) MICROPILLAR OPTOELECTRONIC DEVICE

(71) Applicants: Nikolay Ledentsov, Berlin (DE); Vitaly Shchukin, Berlin (DE)

(72) Inventors: Nikolay Ledentsov, Berlin (DE); Vitaly Shchukin, Berlin (DE)

(73) Assignee: VI Systems GmbH, Berlin (DE)

( * ) Notice: Subject to any disclaimer, the term of this patent is extended or adjusted under 35 U.S.C. 154(b) by 0 days.

(21) Appl. No.: 16/382,127

(22) Filed: Apr. 11, 2019

(65) Prior Publication Data

US 2019/0319429 A1    Oct. 17, 2019

Related U.S. Application Data

(60) Provisional application No. 62/657,245, filed on Apr. 13, 2018.

(51) Int. Cl.
  *H01S 5/183*    (2006.01)
  *H01S 5/50*    (2006.01)
  *H01S 5/14*    (2006.01)
  *H01S 5/20*    (2006.01)

(52) U.S. Cl.
  CPC ......... *H01S 5/18341* (2013.01); *H01S 5/141* (2013.01); *H01S 5/18302* (2013.01); *H01S 5/18311* (2013.01); *H01S 5/18316* (2013.01); *H01S 5/18327* (2013.01); *H01S 5/2027* (2013.01); *H01S 5/50* (2013.01)

(58) Field of Classification Search
  CPC .. H01S 5/141; H01S 5/18311; H01S 5/18302; H01S 5/20

USPC ....................................................... 372/45.01
See application file for complete search history.

(56) References Cited

U.S. PATENT DOCUMENTS

| | | | |
|---|---|---|---|
| 7,030,407 B2 * | 4/2006 | Michler | B82Y 20/00 257/13 |
| 8,249,121 B2 * | 8/2012 | Brenner | H01S 5/1021 372/46.01 |
| 9,190,810 B2 * | 11/2015 | Su | H01S 5/18327 |
| 2004/0096996 A1 * | 5/2004 | Cheng | H01S 5/18305 438/22 |
| 2006/0227823 A1 * | 10/2006 | Mohammed | B82Y 10/00 372/26 |
| 2007/0291808 A1 * | 12/2007 | Ledentsov | H01S 5/0601 372/50.11 |

* cited by examiner

*Primary Examiner* — Tuan N Nguyen
(74) *Attorney, Agent, or Firm* — Gordon Rees Scully Mansukhani LLP

(57) ABSTRACT

The invention discloses a semiconductor optoelectronic micro-device comprising at least one cavity and at least one multilayer interference reflector. The device represents a micrometer-scale pillar with an arbitrary shape of the cross section. The device includes a vertical optical cavity, a gain medium and means of injection of nonequilibrium carriers into the gain medium, most preferably, via current injection in a p-n-junction geometry. To allow high electric-to-optic power conversion at least one contact is placed on the sidewalls of the micropillar overlapping with at least one doped section of the device. Means for the current path towards the contacts and for the heat dissipation from the gain medium are provided. Arrays of micro-devices can be fabricated on single wafer or mounted on single carrier. Devices with different cross-section of the micropillar emit light at different wavelengths.

18 Claims, 10 Drawing Sheets

MICROPILLAR OPTOELECTRONIC DEVICE

REFERENCE TO RELATED APPLICATIONS

This application claims an invention which was disclosed in Provisional Application No. 62/657,245, filed Apr. 13, 2018, entitled "MICROPILLAR OPTOELECTRONIC DEVICE". The benefit under 35 USC § 119(e) of the United States provisional application is hereby claimed, and the aforementioned application is hereby incorporated herein by reference.

BACKGROUND OF THE INVENTION

Field of the Invention

The invention pertains to the field of optoelectronic devices. More particularly, the invention pertains to surface emitting lasers, light-emitting diodes and single photon emitters.

Description of the Prior Art

A prior art semiconductor diode laser, or more specifically, vertical-cavity surface-emitting laser, is shown, as an example, in FIG. 1. The laser structure is grown epitaxially on an n-doped substrate (101). The structure further comprises an n-doped bottom multilayer distributed Bragg reflector (DBR) (102), a p-doped top multilayer distributed Bragg reflector (106), and a vertical cavity section (103) confined between n-doped and p-doped DBRs. Gain medium (105) is preferably placed inside the resonant optical cavity (103) in the maximum of the amplitude of the longitudinal optical mode, called also vertical optical mode, as it is shown in FIGS. 2A and 2B. Carriers flow through the carrier injection layers (104) to the gain medium (105), where they recombine generating light.

Typical VCSELs based on GaAs/GaAlAs materials are oxide-confined VCSELs. Principles of the fabrication of oxide-confined VCSELs are well known in the art. A possibility of such VCSELs is based on the fact, that the wet oxidation rate of an alloy Ga(1−x)Al(x)As extremely rapidly decreases, once a small fraction of GaAs is mixed with AlAs. Thus, the oxidation rate of Ga(1−x)Al(x)As with a moderately high Aluminum composition (~90%) is several times lower than the oxidation rate of an alloy with extremely high Aluminum composition, typically that of 98% Ga(1−x)Al(x)As or of a pure AlAs. Then, upon wet oxidation, one layer or several layers having an ultra-high Aluminum composition form an aperture (140), confined by an oxide layer (145) formed of an electrically-insulating amorphous oxide Ga(1−x)Al(x)O(y).

The rest layers of both bottom DBR (102) and top DBR (106) are formed of alternating layers of moderately high Aluminum composition (132) and layers of low Aluminum composition (131). Preferably moderately high Aluminum composition in the DBR layers is in the range 80%-93%. In the layers of low Aluminum composition (131) pure GaAs can be used, if the targeted wavelength of the laser light is longer than 870 nm, and GaAs is a transparent material. For shorter wavelengths, preferably minimum Aluminum composition, at which the material is transparent, is used in the DBR layers.

Oxidation in the layers of a moderately high Aluminum compositions still occurs, but only on a small depth (137), preferably several times smaller than the oxidation depth in the aperture layer(s) (145). The oxide layer (145) confining the aperture is electrical insulator, and it determines the path of the current such that the recombination in the gain medium, and, thus, generation of light occurs predominantly in the section of the gain medium beneath the aperture. This is the main function of the oxide-confined aperture, to prevent generation of light beneath the top metal contacts, such light would be lost due to absorption in the top contact.

An alternative way of fabrication a current aperture includes epitaxial growth of a material of a strongly different chemical composition, e. g., growth of a $Ga_{0.51}In_{0.49}P$ layer in GaAs/GaAlAs-based structure, the layer being lattice-matched to GaAs substrate. Then selective etching with a selective etchant can be applied, forming an aperture for electric current, confined by air gaps.

Another way of formation an air gap-confined aperture includes formation of an oxide-confined aperture via selective oxidation and subsequent oxide removal by using a selective etchant.

A yet another alternative way of fabrication of an aperture for electric current includes using a tunnel junction.

VCSEL is typically fabricated as a double mesa structure, wherein the lateral size of the top mesa (130) is smaller than the lateral size of the bottom mesa (120). In FIG. 1 a doped layer (128) is located above the aperture layer. This layer defines a boundary between the bottom mesa (120) and the top mesa (130).

Forward bias (113) is applied to the gain medium (105) via the bottom contact (111) mounted on the back side of the substrate (101) and the top contact (112) mounted on top of the contact layer (108) on top of the top DBR (106). Generated laser light (155) is emitted through the top DBR (106).

Various types of the gain medium can be applied. A gain medium can be formed of a double heterostructure, of a single or a multiple quantum well, a single or multiple sheet of quantum wires, a single or multiple sheet of quantum dots, or any combination thereof.

A low density array of quantum dots can be applied. If the quantum dot density is about $1 \times 10^8$ $cm^{-2}$ and the aperture diameter is about 1 micrometer, then there appears on average one quantum dot per aperture. A one skilled in the art will appreciate that, once the average number of quantum dots in the aperture area is small, there occurs a significant dispersion of the actual number of quantum dots beneath or above the corresponding aperture, the probability of having a certain number of quantum dots in many cases obeys Poisson distribution. To get a statistically significant fraction of the devices actually having exactly one quantum dot in the aperture area, it is preferred that the average number of quantum dots in such area is below two. Thus, a low density array of quantum dots enables fabrication of single quantum dot light emitters.

FIG. 3 shows a different configuration of a prior art VCSEL (300). The doped buffer layer (351) is grown on top of the substrate (301), and the bottom contact is mounted on top of the buffer laser (351). The entire epitaxial structure is grown on top of the buffer layer (351). Generated laser light (355) is emitted through the top DBR (106). Such configuration can be used also for the fabrication of VCSELs on a semi-insulating substrate.

FIG. 4 illustrates yet another configuration of a prior art VCSEL (400). The double mesa consisting of a bottom mesa (420) and a top mesa (430) is configured such that the oxide-confined aperture (140) is placed in the top mesa (430). Generated laser light (455) is emitted through the top DBR (106).

FIG. 5 shows a further configuration of a prior art VCSEL (500). The double mesa consisting of a bottom mesa (520) and a top mesa (530) is configured such that both the oxide confined aperture (140), the resonant optical cavity (103) are located in the top mesa (530). Generated laser light (555) is emitted through the top DBR (106).

There exists a broad variety of VCSEL designs. A bottom contact or a top contact, or both contacts can be mounted as intracavity contacts. Then the electric current flows in such a way that there is no current in a part of one DBR, or in parts of both DBRs, or even both DBRs are not a part of the current path. Then such DBRs, partially, or completely, can be made of undoped materials thus reducing optical losses due to free carrier absorption.

In another configuration of a VCSEL, a top DBR, partially, or completely, can be formed of dielectric materials.

In yet another configuration of a VCSEL, a top DBR can be made as a semiconductor/oxide DBR. First, a semiconductor multilayer structure is grown, containing, instead of layers with a moderately high Aluminum composition, layers with extremely high Aluminum composition, preferably above 93%. The layers are configured such that, upon wet oxidation, the aperture layer is oxidized only partially forming an oxide-confined aperture, and the top DBR layers are oxidized completely through the entire layer, thus forming a semiconductor/oxide DBR.

A broad variety of existing VCSEL configurations is described in multiple books (e. g., *Vertical-Cavity Surface-Emitting Lasers: Design, Fabrication, Characterization, and Applications* by C. W. Wilmsen, H. Temkin, L. A. Coldren (editors), Cambridge University Press, 1999, wherein this book is hereby incorporated herein by reference in its entirety).

In various VCSEL designs proton bombardment can be applied for current confinement instead of oxide-confined aperture, selectively formed tunnel junction can be applied, substrate can be transparent to the emission and the laser light can exit the structure from the substrate side. Substrate can be also selectively removed. In case of a non-transparent substrate the light can exit the device from the top.

The substrate and DBR layers can be formed of any III-V semiconductor material or III-V semiconductor alloy. Example substrate materials include, but are not limited to GaAs, InP, and GaSb. GaAs or InP are generally used depending on the targeted emission wavelength of laser radiation. The substrate can represent either a slice of a bulk crystal or an epilayer deposited on a slice of a bulk crystal. Alternatively, sapphire, SiC or Si(111) can be used as substrates for GaN-based lasers, i.e. for laser structures, the layers of which are formed of GaN, AlN, InN, or alloys of these materials. The substrate is preferably doped by n-type, or donor impurity. Possible donor impurities include, but are not limited to S, Se, Te, and amphoteric impurities like Si, Ge, Sn wherein the latter are introduced under such technological conditions that they are incorporated predominantly into the cation sublattice and serve as donor impurities. In various designs p-doped substrates can be used, undoped or semi-insulating substrates can be used, intracavity contacts can be applied.

Recently a strong interest arose in light emitters with very small volume of the optical cavity, for example in photonic crystal lasers and in micropillar lasers. Such devices are predicted to be useful for signal modulation at very high frequency, for single photon single quantum dot (QD) emitters. A typical schematic view of such device (600) is given in FIG. 6. It essentially represents above described vertical cavity structure. However, while the top mesa in typical VCSEL structures have a diameter from 20 to 50 micrometers, the top mesa (630) of a micropillar laser has a diameter of only a few micrometers representing a micropillar. The sidewalls of the micropillar (630) are covered by a dielectric (660) to reduce scattering of the optical modes and ensure electric isolation between p- and n-sections. P-contact (112) is placed on top of the mesa (630), and n-contact is placed on top of an n-buffer layer (351). In another configuration of a micropillar laser an n-contact can be mounted on top of an n-DBR section. In yet another configuration an n-contact is mounted on the bottom side of the substrate. The micropillar laser is capable to emit from few to few hundred microwatts of light in the lasing mode. Modifications are possible similar to modifications in conventional VCSEL designs.

SUMMARY OF THE INVENTION

The invention discloses a semiconductor optoelectronic micro-device comprising at least one cavity and at least one multilayer interference reflector. The device represents a micrometer-scale pillar with an arbitrary shape of the cross section. The device includes a vertical optical cavity, a gain medium and means of injection of nonequilibrium carriers into the gain medium, most preferably, via current injection in a p-n-junction geometry. To allow high electric-to-optic power conversion at least one contact is placed on the sidewalls of the micropillar overlapping with at least one doped section of the device. Means for the current path towards the contacts and for the heat dissipation from the gain medium are provided. Arrays of micro-devices can be fabricated on single wafer or mounted on single carrier. Devices with different cross-section of the micropillar emit light at different wavelengths.

DETAILED DESCRIPTION OF THE INVENTION

Figure 7:
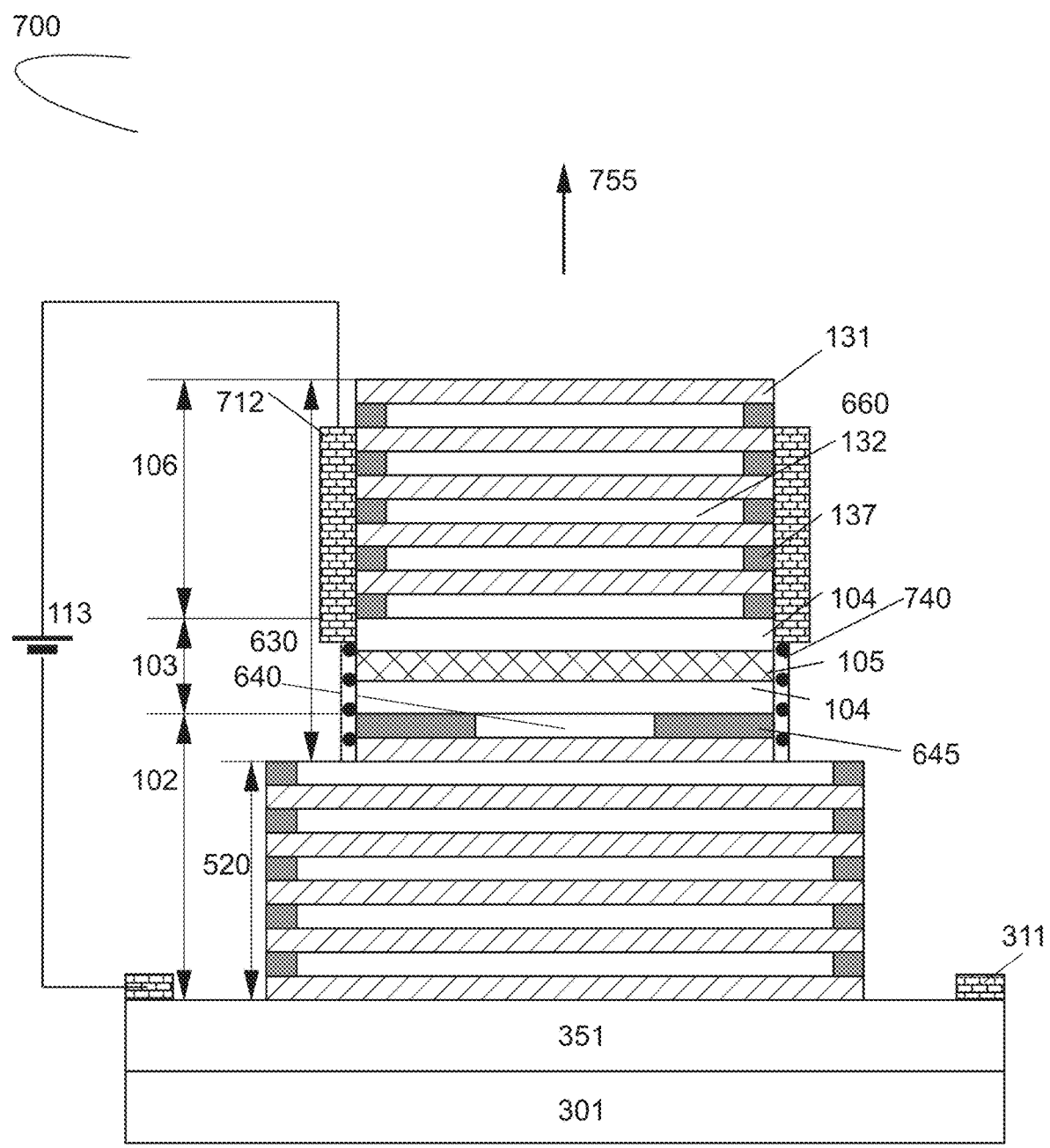
FIG. 7 shows a schematic diagram of a micropillar laser according to the preferred embodiment of the present invention.

FIG. 7 illustrates a micropillar laser (700) according to the preferred embodiment of the present invention. The metal contact (712) is deposited on the sidewall of the micropillar (630) and provides an electric contact to the doped section of the DBR (106), which is connected with the p-n junction section, whereas this p-n junction section further contains the gain medium. In this embodiment the p-n junction containing the gain medium (105) is placed in the resonant optical cavity (103).

Figure 6:
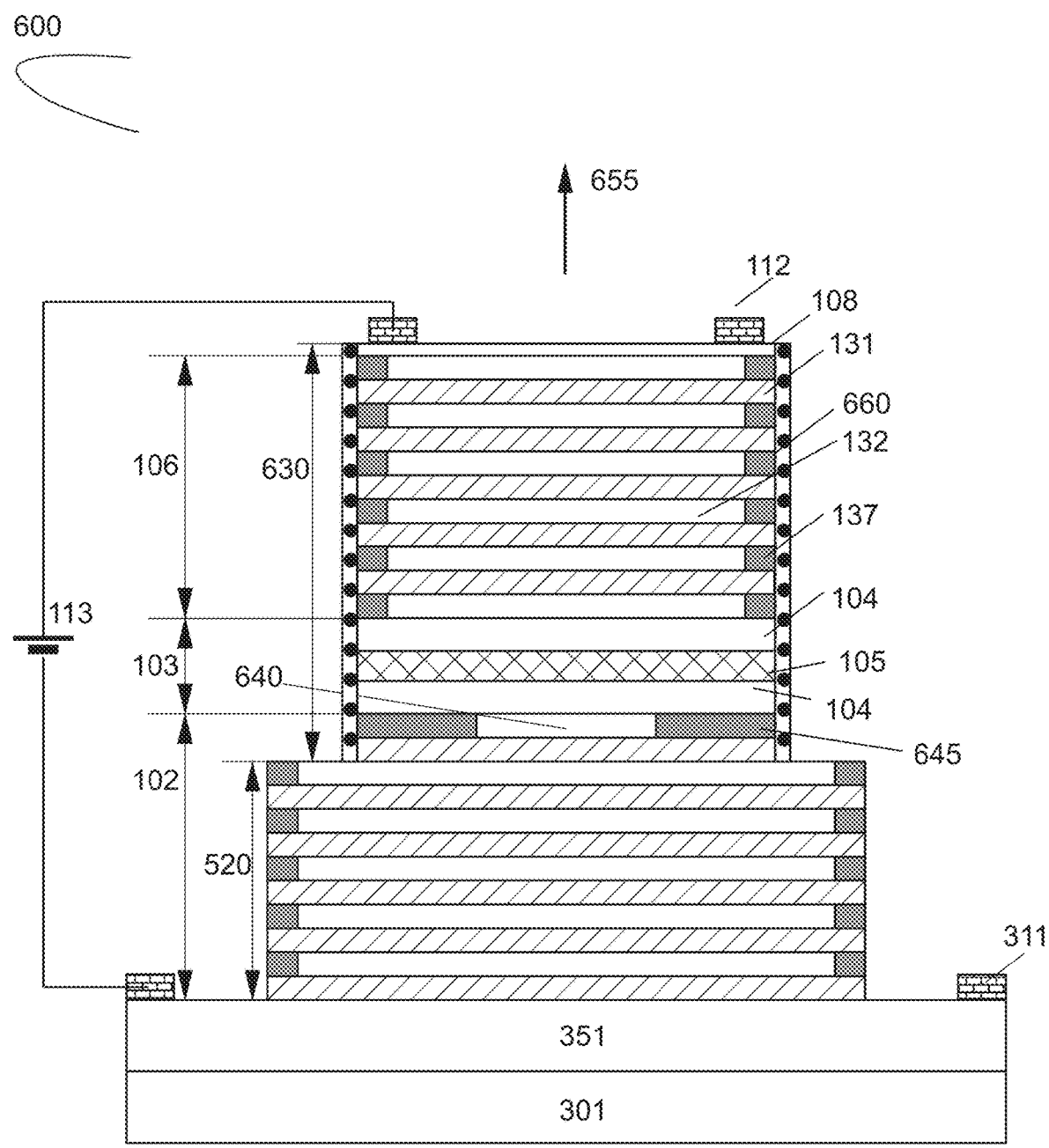
FIG. 6 shows a schematic diagram of a prior art micropillar laser.

A one skilled in the art will appreciate that using a combination of a micropillar with a sufficiently small lateral dimension, e. g., below 5 micrometer and a contact on a sidewall of the micropillar significantly reduces the series resistance of the device. First, the resistance is reduced with respect to a conventional VCSEL having intracavity contact, just due to a shorter path between the contact and the gain medium, because of a small lateral size of the micropillar. Second, the resistance is reduced with respect to the prior art micropillar device of FIG. 6 with the contact on the top, as the current path in FIG. 7 does not any longer contain a large number of interfaces between layers with low and high Aluminum composition. Reduction of the series resistance will reduce the parasitics time constant of the device and thus improve its high frequency performance.

Optionally a part of the side surface of the micropillar (630) can be covered by a dielectric (740). However, it is important that at least 30% of the metal-covered surface is free from dielectric. For example, partial selective oxidation of Ga(1−x)Al(x)As DBR layers and aperture layer(s) does not hinder effective current conductivity from the sidewalls. The resistance of the current path through the micropillar (630) or through a section of the micropillar will be strongly reduced as compared to the case where the contact pad is placed on top of the micropillar structure as the contact (112) of the micropillar laser (600). The metal contact (712) mounted on a side wall of the micropliiar (630) is typically enhanced by a thick galvanic gold. The thickness of galvanic gold is preferably in the interval from 1 to 3 micrometers.

A one skilled in the art will appreciate that the same approach of FIG. 7 can be applied not necessarily to a micropillar laser, but to a conventional VCSEL having the top mesa diameter, say between 5 micrometers and 20 micrometers. Once a contact is placed on a sidewall of a VCSEL, the series resistance of the device will be significantly reduced. First, there will be still a shorter path between the contact and the gain medium as compared to the intracavity contact placed on a layer of a bottom mesa. Second, the resistance is reduced with respect to prior art VCSELs illustrated in FIGS. 1, 3, 4, and 5, as the current path does not any longer contain a large number of interfaces between layers with low and high Aluminum composition. Reduction of the series resistance will reduce the parasitics time constant of the device and thus improve its high frequency performance. If the aperture diameter is below 5 µm, the structure is effectively a micropillar laser, similar to the one illustrated in FIG. 7.

Figure 8:
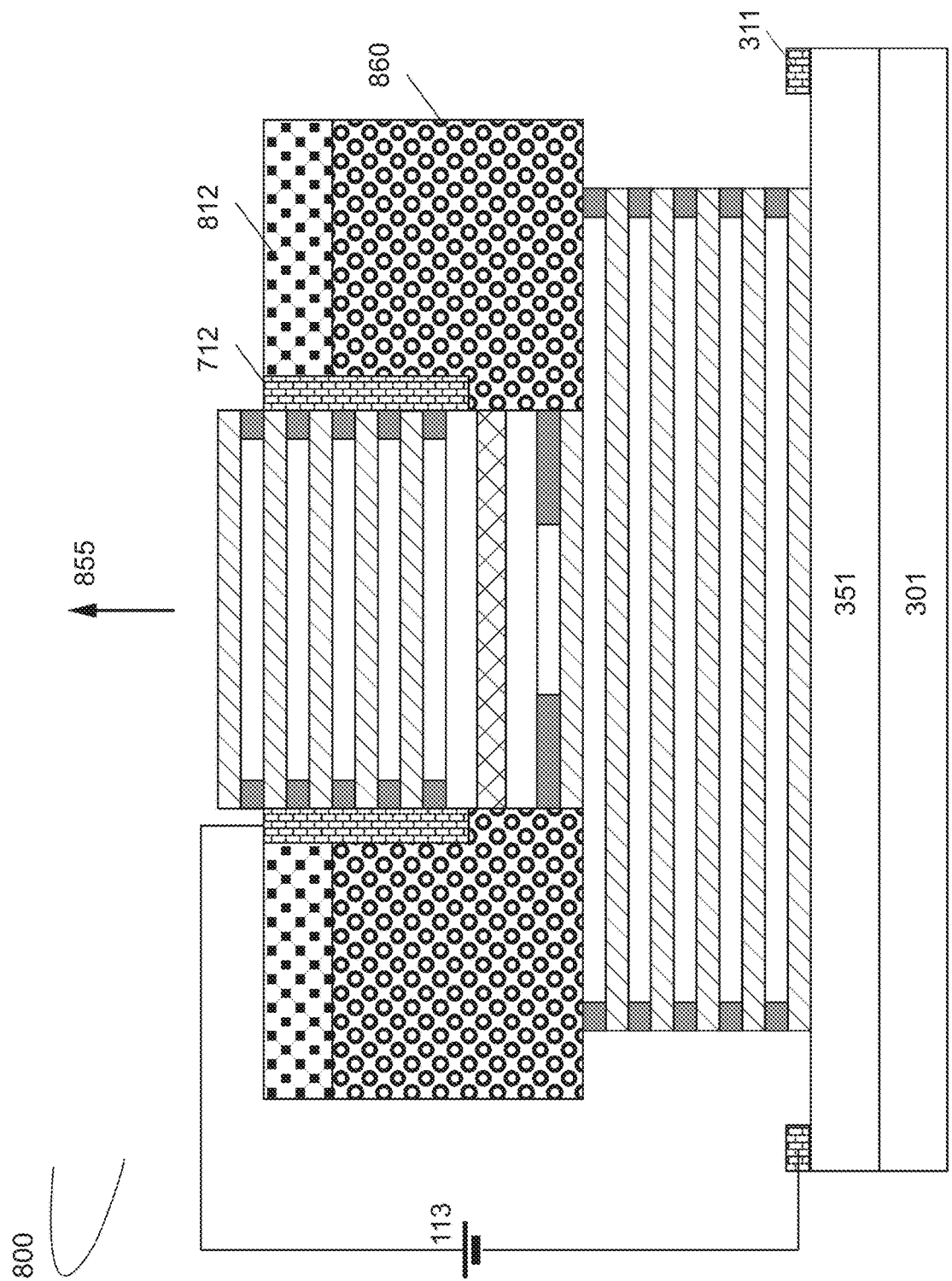
FIG. 8 shows a schematic diagram of a micropillar laser according to another embodiment of the present invention, whereas the micropillar laser contains special means for efficient heat dissipation.

FIG. 8 illustrates a micropillar laser (800) according to another embodiment of the present invention. An additional layer of metal (812) having a high thermal conductivity is deposited. This layer serves as an additional electric contact further reducing the contact electric resistance of the contact (712). Possible materials for the contact (812) include, but are not limited to galvanic gold. This additional metal layer (812) can be also used as a heat spreader. Further, the entire micropillar is confined from the sides by a combination of metal with high thermal conductivity (812) and a dielectric with high thermal conductivity (860) which allows a significant improvement of thermal properties of the microdevice. Possible dielectric materials include but are not limited to $Si_3N_4$ having the thermal conductivity ~2 W/(m K) at room temperature, or $Al_2O_3$ having the thermal conductivity ~2.9 W/(m K). Thus, the value of 2 W/(m K) or above is preferred.

A one skilled in the art will appreciate that the illustrated embodiments can be extended and other types of microdevices can be realized in a similar way. Yet another embodiment of the present invention includes processed as a micro-device a surface-emitting titled cavity laser. The concept of the tilted cavity laser was disclosed in the patent "TILTED CAVITY SEMICONDUCTOR LASER AND METHOD OF MAKING SAME", U.S. Pat. No. 7,031,360, filed Feb. 12, 2002, issued Apr. 18, 2006, and in the patent application "TILTED CAVITY SEMICONDUCTOR OPTOELECTRONIC DEVICE AND METHOD OF MAKING SAME", US Patent Application Publication 2005/0040410, filed Sep. 16, 2004, published online Feb. 24, 2005, both by the inventors of the present invention, wherein both are hereby incorporated herein by reference in their entirety. In this embodiment multilayer interference reflectors are applied instead of conventional distributed Bragg reflectors, wherein the multilayer interference reflectors are configured to provide the maximum reflectivity at a targeted non-zero tilt angle between the direction of propagation of light in the lasing optical mode and the normal direction to the layers.

A further embodiment of the present invention includes a passive cavity surface emitting laser, processed as a micro-device, wherein the concept of the passive cavity laser was disclosed in the patent "OPTOELECTRONIC DEVICE AND METHOD OF MAKING SAME", U.S. Pat. No. 8,472,496, filed Jul. 6, 2010, issued Jun. 25, 2013, by one of the inventors of the present invention, Ledentsov, wherein this patent is hereby incorporated herein by reference in its entirety.

Figure 9:
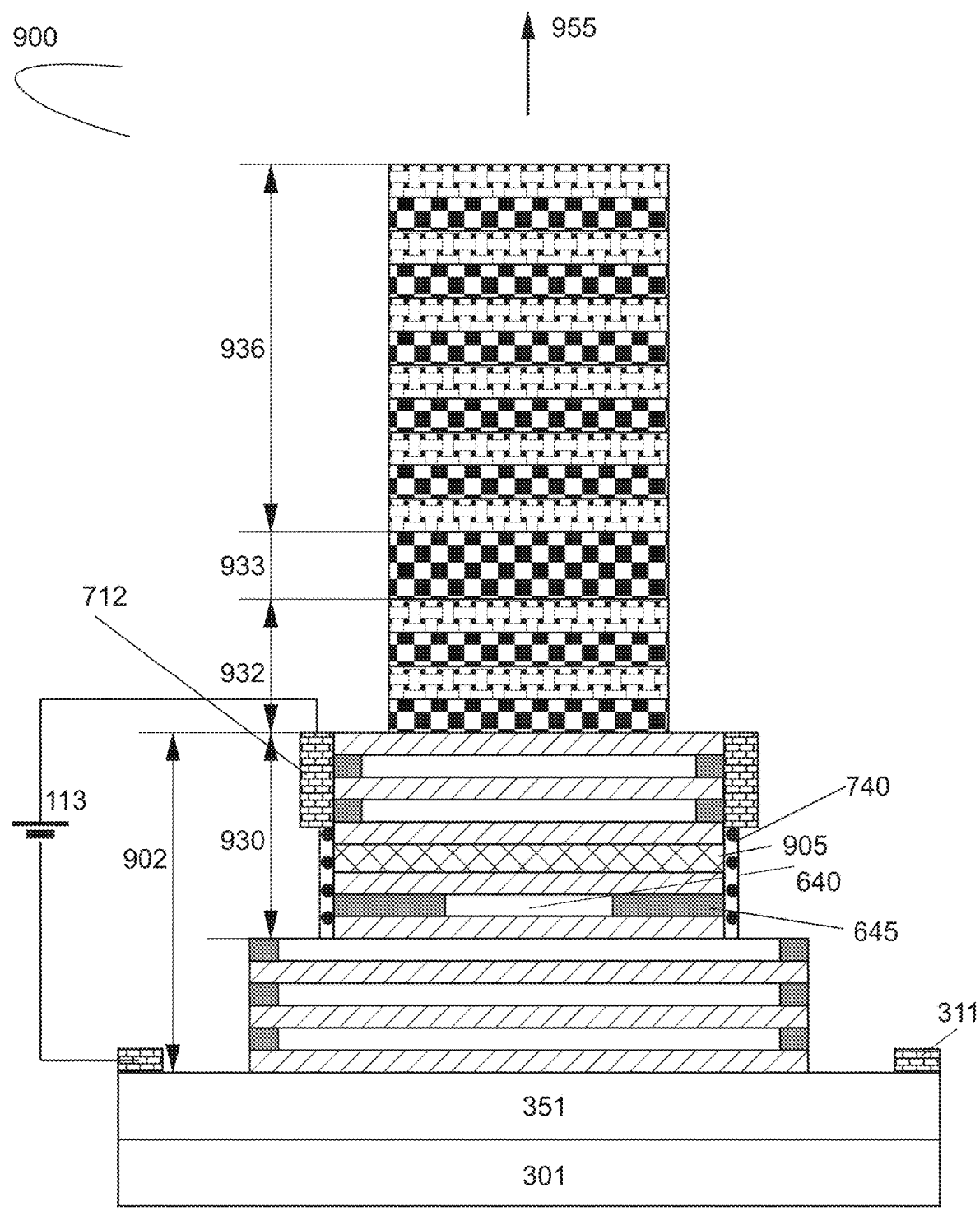
FIG. 9 shows a schematic diagram of a passive cavity micropillar laser according to yet another embodiment of the present invention.

FIG. 9 illustrates schematically a passive-cavity surface-emitting micropillar laser device (900), according to this embodiment. The multilayer semiconductor structure (902) is configured as a bottom semiconductor DBR, functioning as a part of the bottom DBR of the entire device (900). The gain medium (905) is placed into one of the layers of the bottom semiconductor DBR (902), between the n-doped and the p-doped sections of the bottom semiconductor DBR (902). The n-contact (311) mounted on the buffer layer (351), and the p-contact (712) is mounted on the side surface of the top semiconductor mesa (930), thus both contacts being mounted on the same bottom semiconductor DBR (902). A multilayer dielectric structure is deposited on top of the top semiconductor mesa (930). The dielectric structure includes the bottom dielectric DBR (932), the dielectric resonant optical cavity (933), and the top dielectric DBR (936). Thus the entire micropillar device (900) contains the resonant cavity (933) placed between the bottom DBR and the top DBR (936), the bottom DBR including the semiconductor section (902) and the dielectric section (932). The dielectric cavity (933) is a passive cavity as the gain medium (905) is placed outside the cavity. Thus, the micropillar device (900) is a passive cavity laser. Laser light (955) exits the device through the dielectric structure in the vertical direction upwards.

Figure 1:
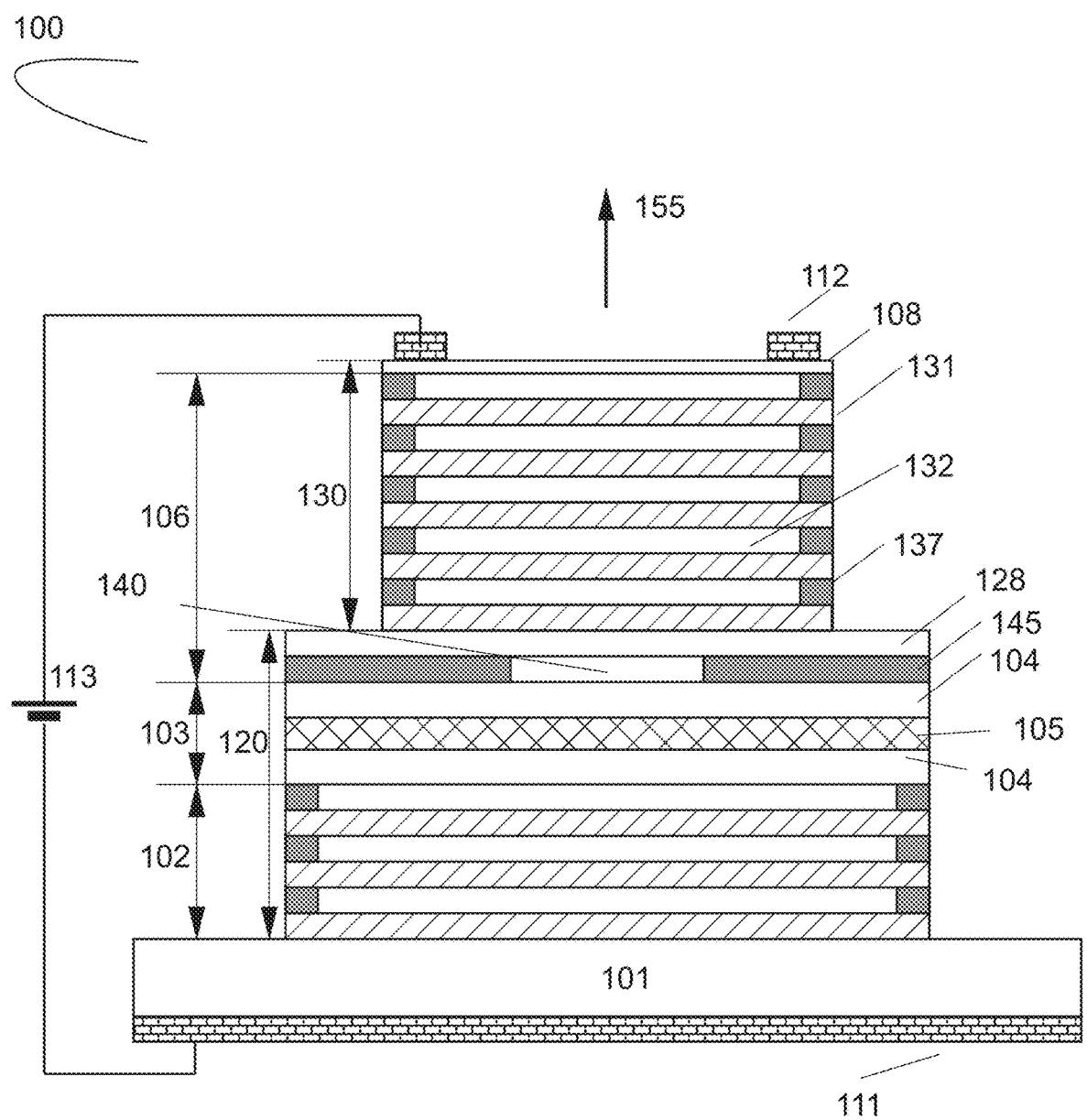
FIG. 1 shows a schematic diagram of the prior art of an oxide-confined vertical-cavity surface-emitting laser (VCSEL) grown on a doped substrate
Figure 2A:
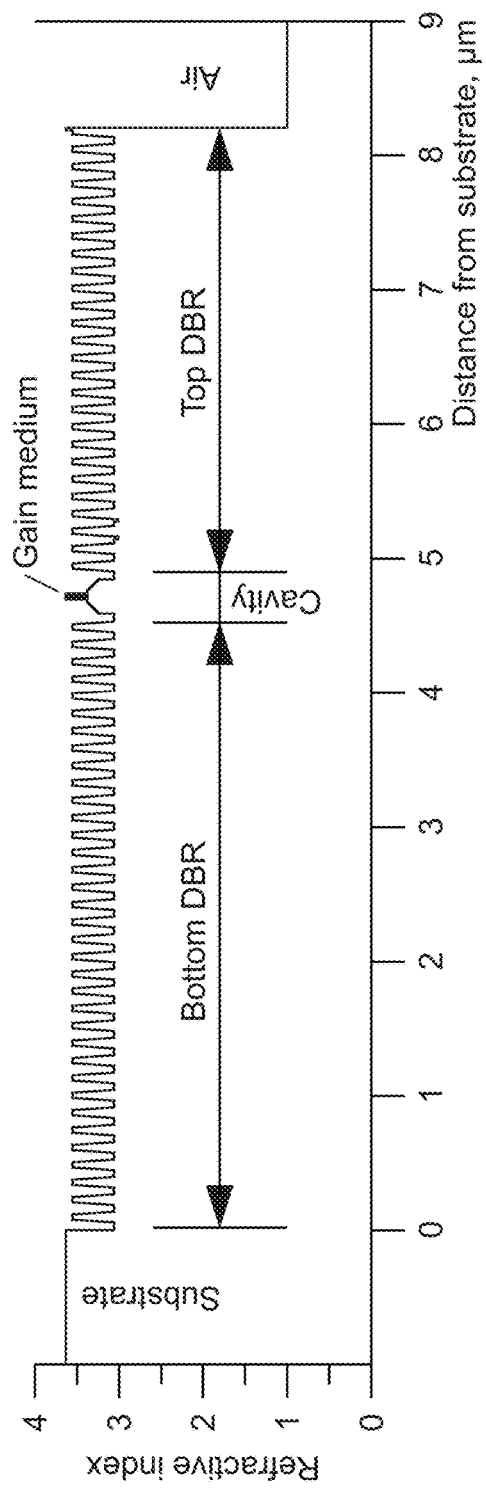
FIG. 2A illustrates schematically an refractive index profile of a typical VCSEL, in which the optical cavity is confined between two distributed Bragg reflectors.
Figure 2B:
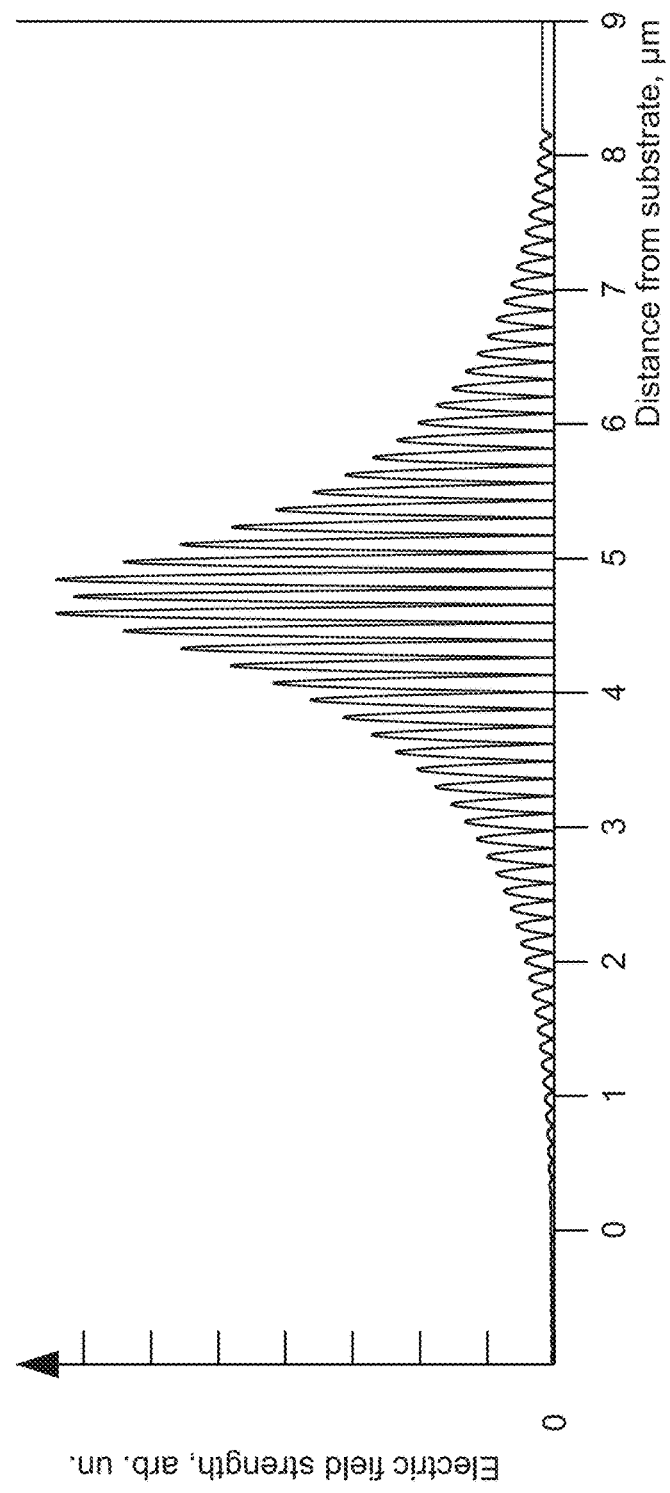
FIG. 2B illustrates schematically a vertical profile of the vertical optical mode of the VCSEL structure of FIG. 2A.
Figure 3:
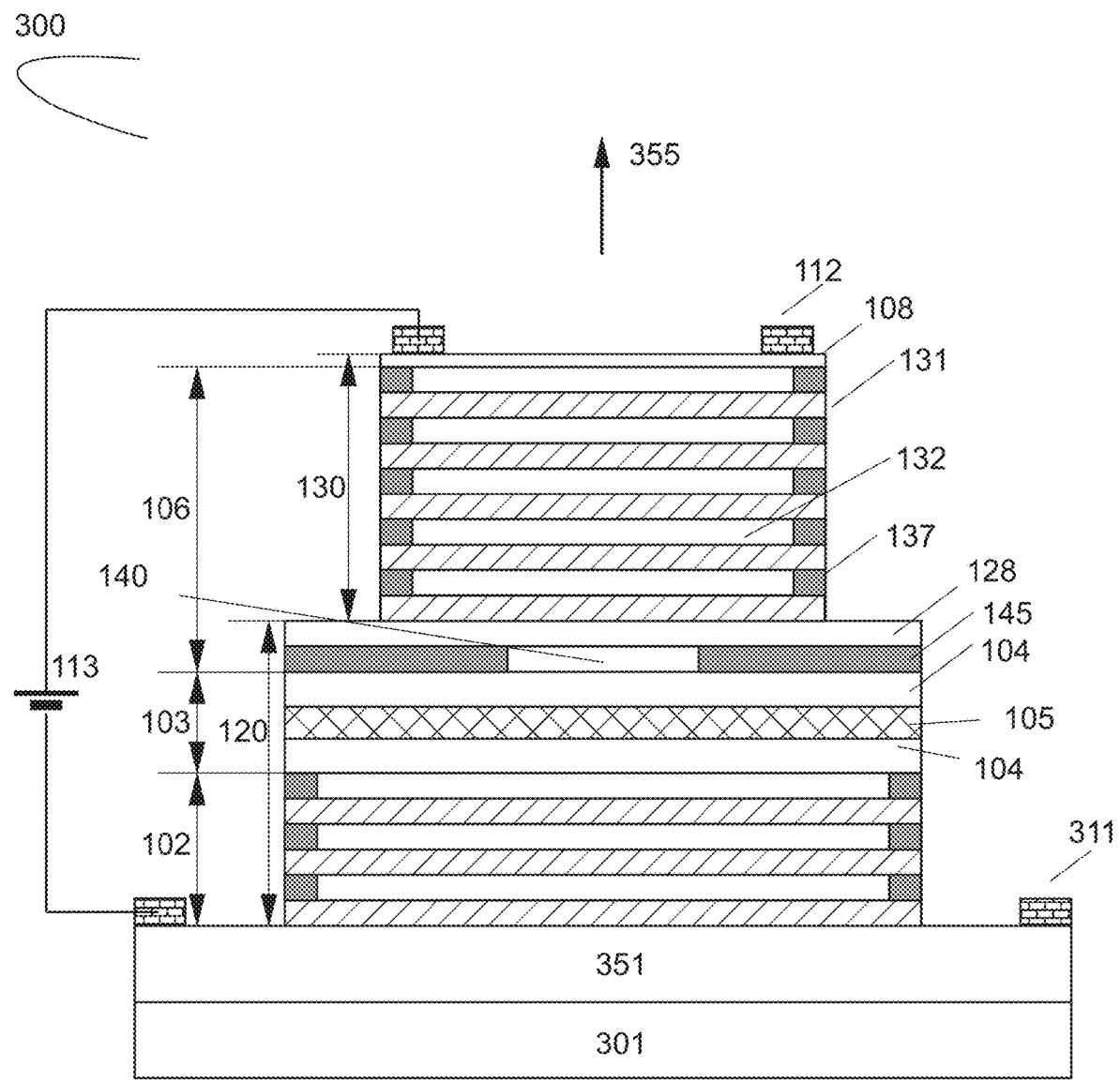
FIG. 3 shows a schematic diagram of the prior art of an oxide-confined vertical-cavity surface-emitting laser (VCSEL) grown on a doped buffer layer.
Figure 4:
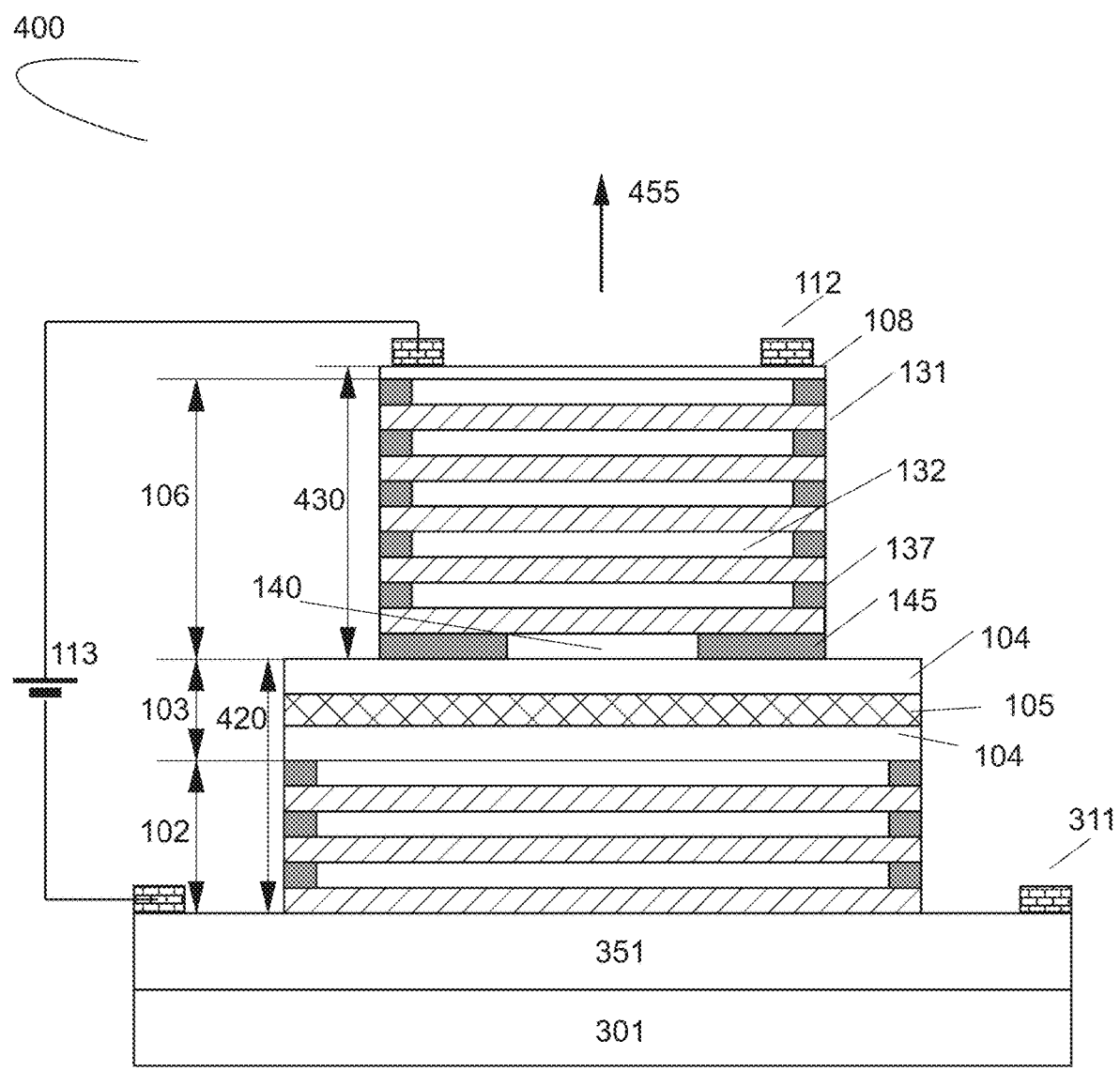
FIG. 4 shows a schematic diagram of the prior art of an oxide-confined vertical-cavity surface-emitting laser (VCSEL) having an oxide-confined aperture in the top mesa.
Figure 5:
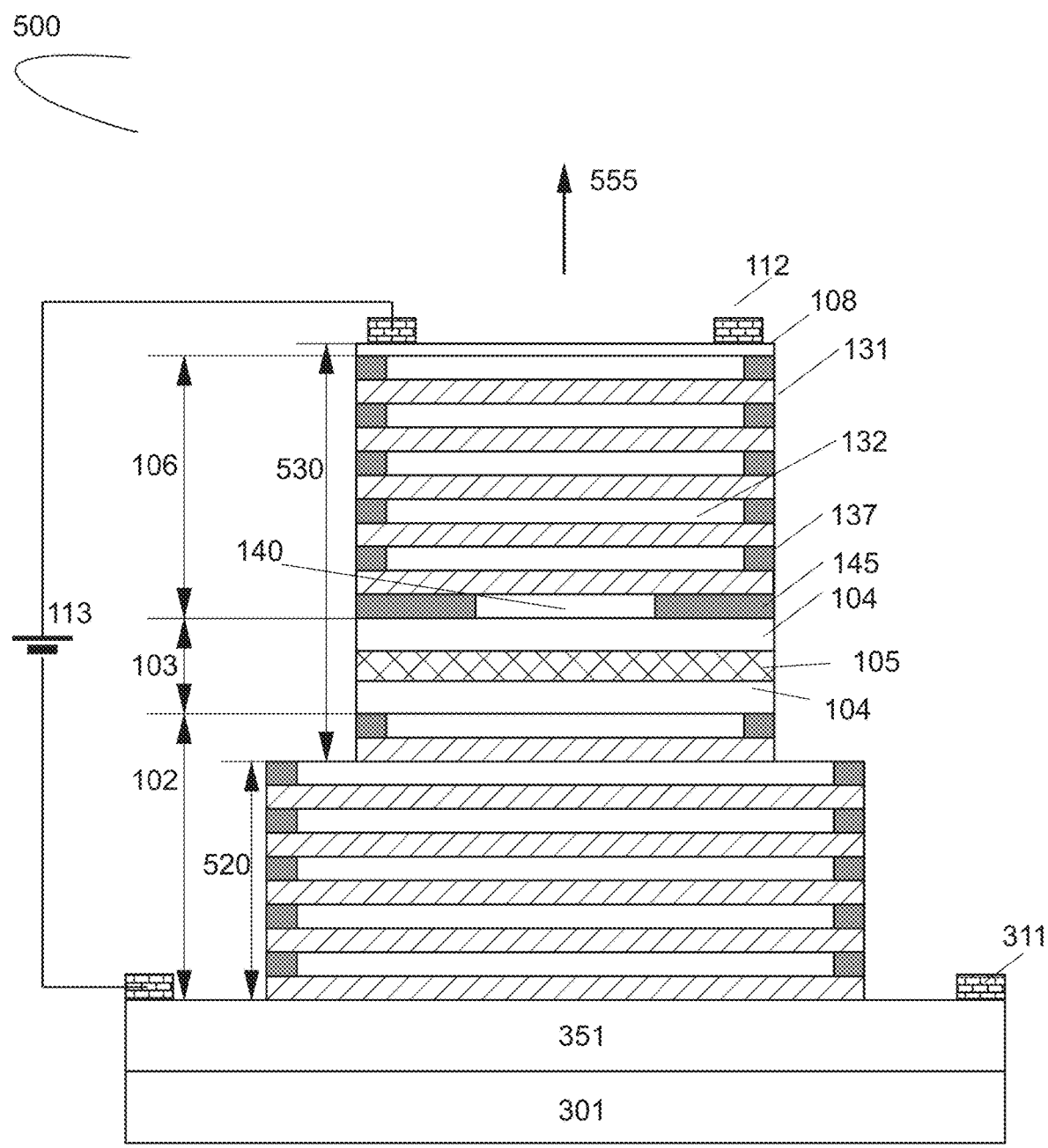
FIG. 5 shows a schematic diagram of the prior art of an oxide-confined vertical-cavity surface-emitting laser (VCSEL) having both an oxide-confined aperture and a resonant optical cavity in the top mesa.

A one skilled in the art will appreciate that the longitudinal optical mode, similar to that displayed in FIG. 2B, is associated with a lateral optical mode describing the optical field profile in the lateral plane. As the dielectric material in the cavity (933) has a higher refractive index than the refractive index of the air (equal 1), the lateral optical mode is confined in the lateral plane within the micropillar, having an optical field in the air outside the micropillar evanescently decaying away from the micropillar. Having the same profile of the longitudinal optical mode as in FIG. 2B, the lateral profile of the lateral optical mode varies upon variation of the micropillar diameter. Consequently, the optical mode confined in a micropillar of a larger diameter has a longer wavelength, than the optical mode confined in a micropillar of a smaller diameter. Thus, the lasing wavelength can be influenced by the lateral dimensions of the passive dielectric cavity which can be controlled with a high precision, approximately 0.1 micrometer. An array of micropillar devices is possible, wherein the micropillar diameter varies across the array, the array thus being suitable for applications in wavelength division multiplexing systems. The feasible precision is much higher than that in the case of conventional oxide-confined VCSELs, whereas the lasing wavelength is governed by the diameter of the oxide-confined aperture, the precision of its control being rather poor, about 0.5 micrometer.

Figure 10:
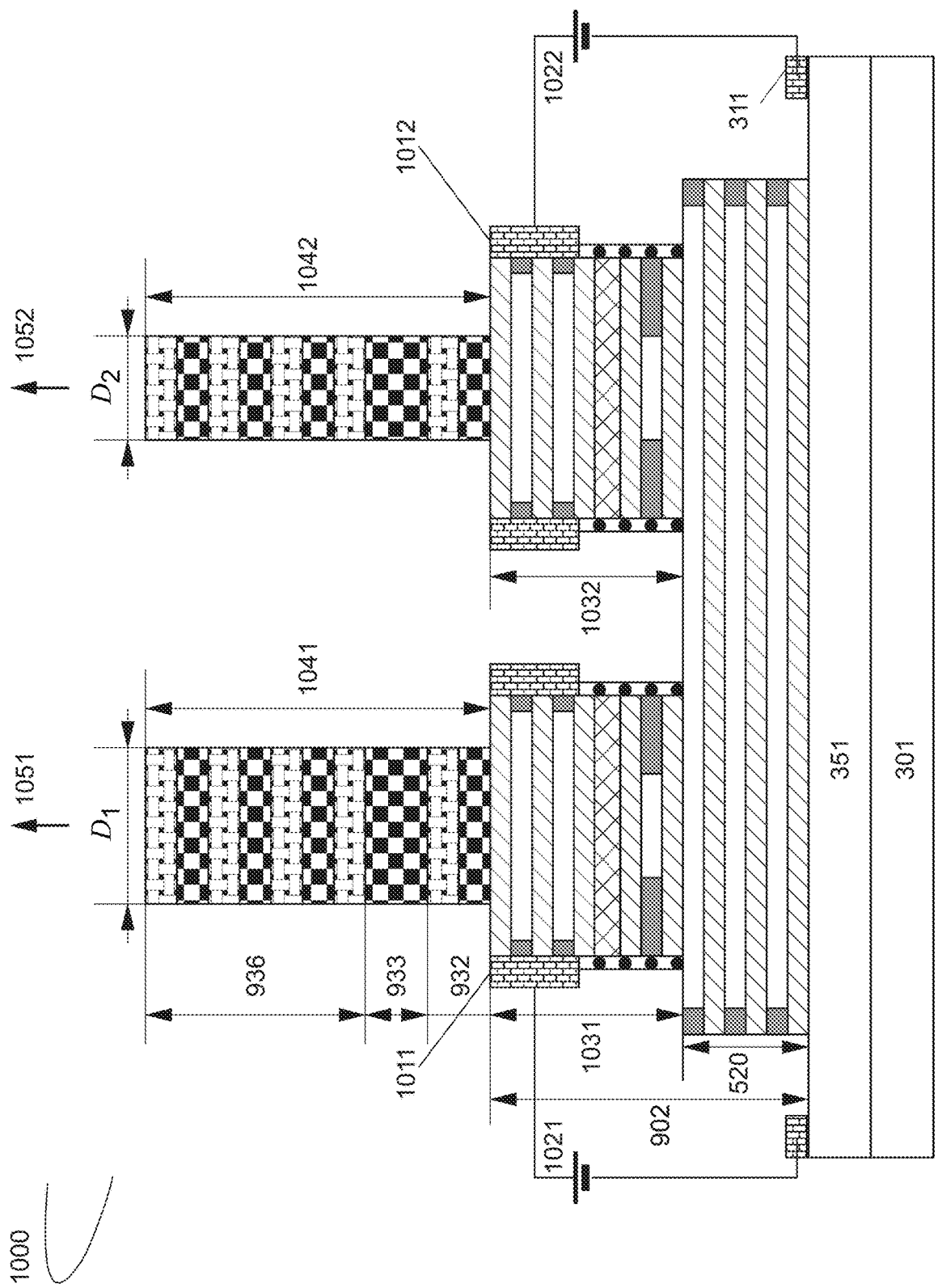
FIG. 10 shows a schematic diagram of a section of a multiwavelength micropillar laser array according to a further embodiment of the present invention.

FIG. 10 shows schematically a section (1000) of a multiwavelength micropillar laser array. The array has a common substrate (301), a common buffer layer (351), and a common bottom mesa (520). On top of the bottom mesa different passive cavity micropillar lasers of FIG. 9 are fabricated. FIG. 10 displays two such micropillar lasers. A first micropillar laser contains a top semiconductor mesa (1031) and a dielectric mesa (1041) on top of the top semiconductor mesa (1031). A top contact (1011) is mounted on a side wall of a top semiconductor mesa (1031). A forward bias (1021) is applied via the top contact (1011) to the gain medium. The dielectric micropillar diameter $D_1$ and emits the laser light (1051) at a wavelength $\lambda_1$.

A second micropillar laser contains a top semiconductor mesa (1032) and a dielectric mesa (1042) on top of the top semiconductor mesa (1032). A top contact (1012) is mounted on a side wall of a top semiconductor mesa (1032). A forward bias (1022) is applied via the top contact (1012) to the gain medium. The dielectric micropillar diameter $D_1$ and emits the laser light (1052) at a wavelength $\lambda_2$.

As the two dielectric micropillars have different diameters, they emit laser light at different wavelengths.

Another embodiment of the present invention includes a light-emitting device comprising an antiwaveguiding cavity, the device being processed as a micro-device. The concept of a light-emitting device comprising an antiwaveguiding cavity was disclosed in the patent "OPTOELECTRONIC DEVICE BASED ON AN ANTIWAVEGUIDING CAVITY", U.S. Pat. No. 7,339,965, filed Apr. 5, 2005, issued Mar. 4, 2008, by the inventors of the present invention, wherein this patent is hereby incorporated herein by reference in its entirety.

Yet another embodiment of the present invention includes an optical amplifier processed as a micro-device.

A further embodiment of the present invention includes a photodetector processed as a micro-device.

Another embodiment of the present invention includes an additional section. Such a section can be configured as a second cavity which can be tuned to be in resonance or off-resonance, realizing an electrooptically-modulated VCSEL, as was disclosed in the patent "ELECTROOPTICALLY WAVELENGTH-TUNABLE OPTOELECTRONIC DEVICE FOR HIGH-SPEED DATA TRANSFER", U.S. Pat. No. 7,369,583, filed Jun. 2, 2005, issued May 6, 2008, by the inventors of the present invention, wherein this patent is hereby incorporated herein by reference in its entirety. The second cavity contains a modulator element, the refractive index of which can be tuned electronically by Quantum Confined Stark effect or by the effect of bleaching. Thus, by applying a variable voltage to the second cavity, the second cavity can be put in resonance or off-resonance with the first cavity thus increasing or decreasing the optical output power. Such a device is a three-terminal device, and a micro-device employing this concept contains preferably at least two of three electrical contacts mounted on the side wall of the pillars, the two contacts on the pillar being separated by dielectric.

Yet another embodiment of the present invention employs a micropillar-device containing an electrooptical modulator section placed not in a resonant cavity, but in a DBR, wherein applying electric voltage to the modulator affects its refractive index and thus alters the optical transmittance of the DBR, as disclosed in the patent "ELECTROOPTICALLY BRAGG-REFLECTOR STOPBAND-TUNABLE OPTOELECTRONIC DEVICE FOR HIGH-SPEED DATA TRANSFER", U.S. Pat. No. 7,593,436, filed Jun. 16, 2006, issued Sep. 22, 2009, by the inventors of the present invention, wherein this patent is hereby incorporated herein by reference in its entirety.

A further embodiment of the present invention refers to a micropillar-device, which DBR contains at least two subsets of layers having two different periodicities, aimed to suppress parasitic optical modes propagating at large tilt angles to the vertical direction, according to the patent application "RESONANT CAVITY OPTOELECTRONIC DEVICE WITH SUPPRESSED PARASITIC MODES", US Patent Application Publication 20070290191, filed Jun. 6, 2007, published online Dec. 20, 2007, by the inventors of the present invention, wherein this patent application is hereby incorporated herein by reference in its entirety.

Further embodiments are possible, which additionally comprise some of all of the following elements: contact layers, contacts, oxide apertures. Additionally deposited layers may be either semiconductor layers or dielectric layers or any combination thereof.

The present invention can also be applied in tunable vertical cavity surface emitting lasers (VCSELs) and tunable tilted cavity lasers wherein the cavity comprises, along with the light generating element, also a modulator element. The modulator element further comprises a modulating layer, the refractive index of which can be tuned electronically due to a quantum confinement Stark effect or by the effect of bleaching. Tuning of the refractive index within one layer within a cavity results in a shift of the wavelength of the emitted laser light, as disclosed in the patent "WAVELENGTH-TUNABLE VERTICAL CAVITY SURFACE-EMITTING LASER AND METHOD OF MAKING SAME", U.S. Pat. No. 6,611,539, filed May 29, 2001, issued Aug. 26, 2003, and in the patent application "INTELLIGENT WAVELENGTH DIVISION MULTIPLEXING SYSTEMS BASED ON ARRAYS OF WAVELENGTH TUNABLE LASERS AND WAVELENGTH TUNABLE RESONANT PHOTODETECTORS", U.S. Pat. No. 7,075,954, filed Jun. 5, 2003, issued Jul. 11, 2006, both by the inventors of the present invention, wherein both patents are hereby incorporated herein by reference in their entirety.

In another embodiment of the present invention, a wavelength-tunable resonant photodetector is disclosed which employs a vertical cavity geometry, or a tilted cavity geometry, having a guiding or an antiwaveguiding cavity. In such photodetector, an increase of the refractive index in a modulator results in a decrease of the resonant wavelength of the resonant photodetector.

In yet another embodiment of the present invention, a wavelength-tunable resonant photodetector is designed such that an increase of the refractive index in a modulator results in an increase of the resonant wavelength of the resonant photodetector.

In a further embodiment of the present invention, a wavelength-tunable resonant optical amplifier is disclosed which employs vertical cavity geometry, or tilted cavity geometry and has an antiwaveguiding cavity. In such optical amplifier, an increase of the refractive index in a modulator results in a decrease of the resonant wavelength of the resonant optical amplifier.

In another embodiment of the present invention, a wavelength-tunable resonant optical amplifier is designed such that an increase of the refractive index in a modulator results in an increase of the resonant wavelength of the resonant optical amplifier.

In yet another embodiment of the present invention, a wavelength-tunable light emitting diode (LED) is disclosed, wherein the spectrum of the emitted light is tuned within the same intrinsic emission band of the gain material. In one sub-embodiment, a wavelength-tunable light emitting diode is designed such that an increase of the refractive index in a modulator results in a decrease of the wavelength of the maximum emission. In another sub-embodiment, a wavelength-tunable light emitting diode is designed such that an increase of the refractive index of a modulator results in an increase of the wavelength of the maximum emission.

In a further embodiment of the present invention an array of micropillars is used to increase the optical power of the device. In case micropillars act as optical amplifiers an external resonator can be applied to result in coherent lasing once all the micropillars are identical.

In case the diameter of the micropillars is different or a shape of the cross section of the micropillars is different the wavelength of the emitted light will be different and shorter wavelength emission can be achieved for the micropillar devices having a smaller effective diameter due to the effect of lateral confinement of optical modes. In another embodiment of the present invention multi-wavelength arrays of micropillars are employed suitable for applications in wavelength division multiplexing for data- and tele-communication.

In yet another embodiment of the present invention an array of micropillars emitting light at different wavelengths is employed as a source of light for glass-free three-dimensional displays, according to the patent "DEVICE FOR GENERATION OF COLORED VIRTUAL THREE-DIMENSIONAL IMAGES", U.S. Pat. No. 9,936,193, filed May 9, 2016, issued Apr. 3, 2018, by one of the inventors of the present invention, Ledentsov, and to the patent "LASER SYSTEM FOR GENERATION OF COLORED THREE-DIMENSIONAL IMAGES", U.S. Pat. No. 10,205,935, filed Aug. 1, 2017, issued Feb. 12, 2019, by the inventors of the present invention, wherein these patents are hereby incorporated herein by reference in their entirety.

Micropillar arrays can be fabricated from a single epitaxial wafer. As an alternative, micropillar arrays can be also transferred onto a carrier wafer through automated technique, wherein possible carrier wafers include, but are not limited to: silicon wafer, plastic wafer, tape, etc.

Although the invention has been illustrated and described with respect to exemplary embodiments thereof, it should be understood by those skilled in the art that the foregoing and various other changes, omissions and additions may be made therein and thereto, without departing from the spirit and scope of the present invention. Therefore, the present invention should not be understood as limited to the specific embodiments set out above but to include all possible embodiments which can be embodied within a scope encompassed and equivalents thereof with respect to the features set out in the appended claims.

What is claimed is:

1. A micropillar semiconductor optoelectronic device comprising
   i) at least one cavity;
   ii) at least one multilayer interference reflector,
   iii) an n-doped semiconductor section, and
      a p-doped semiconductor section, and
      a p-n junction sandwiched between said n-doped semiconductor section and said p-doped semiconductor section,
   iv) a gain medium placed within said p-n junction, and
   v) at least two electric contacts,
      further comprising at least one n-contact and at least one p-contact,
   wherein said at least one multilayer interference reflector represents a micropillar having lateral dimensions smaller than five micrometers;
   wherein said micropillar further comprises a sidewall;
   wherein at least one contact of said at least two contacts is placed on said sidewall of said micropillar overlapping with said at least one doped semiconductor section.

2. The micropillar semiconductor optoelectronic device of claim 1,
   further comprising an aperture,
      wherein said aperture has an aperture area,
      wherein said aperture is fabricated using a method selected from the group of the methods consisting of:
         A) selective oxidation of at least one AlAs-rich layer, wherein said at least one AlAs-rich layer is selected from the group consisting of:
            I) a layer of binary AlAs, and
            II) a layer of a Ga(1−x)Al(x)As alloy, wherein Aluminum content (x) in said Ga(1−x)Al(x)As alloy exceeds ninety-three percent;
         B) selective oxidation as in A) followed by oxide removal and formation of at least one air gap;
         C) selective chemical etching; and
         D) formation of a tunnel junction;
      wherein said aperture provides current confinement; and
      wherein said aperture provides optical confinement.

3. The micropillar semiconductor optoelectronic device of claim 2,
   wherein said gain medium is selected from the group consisting of:
      A) a double heterostructure,
      B) a single or multiple quantum well,
      C) a single or multiple sheet of quantum wires,
      D) a single or multiple sheet of quantum dots,
      E) a single or multiple sheet of low density quantum dots, wherein said low density quantum dots is such that the average number of quantum dots in said aperture area is below two, and F) any combination of A) through E).

4. The micropillar semiconductor optoelectronic device of claim 1, selected from the group consisting of
a) a diode laser,
wherein light is generated in said gain medium when a forward bias is applied via said p-contact and said n-contact;
b) a resonant cavity photodetector,
wherein a reversed bias is applied via said p-contact and said n-contact and
wherein a photocurrent is generated when light is absorbed;
c) a resonant cavity optical amplifier,
wherein light is amplified in said gain medium, when a forward bias is applied via said p-contact and said n-contact;
d) a light-emitting diode,
wherein light is generated when a forward bias is applied via said p-contact and said n-contact; and
e) a single quantum dot light emitter,
wherein light is generated when a forward bias is applied via said p-contact and said n-contact.

5. The micropillar semiconductor diode laser of claim 4, selected from the group consisting of:
A) a vertical cavity surface-emitting laser;
B) a tilted cavity surface-emitting laser; and
C) a passive cavity surface-emitting laser.

6. The micropillar semiconductor resonant cavity photodetector of claim 4 selected from the group consisting of:
AA) a vertical cavity resonant cavity photodetector; and
BB) a tilted cavity resonant cavity photodetector.

7. The micropillar semiconductor resonant cavity optical amplifier of claim 4 selected from the group consisting of:
i) a vertical cavity resonant cavity optical amplifier; and
ii) a tilted cavity resonant cavity optical amplifier.

8. A semiconductor device representing an array of micropillar semiconductor optoelectronic devices according to claim 1,
wherein said array comprises at least two said micropillar semiconductor optoelectronic devices.

9. The semiconductor device of claim 8,
wherein at least two said micropillar semiconductor optoelectronic devices are at least two resonant optical amplifiers, and
wherein optical feedback for said array is provided by an external resonator.

10. The semiconductor device of claim 8,
wherein said at least two micropillar semiconductor optoelectronic devices are at least two semiconductor diode lasers; and
wherein said at least two semiconductor diode lasers have different cross-sections of said at least two micropillars;
wherein each of said at least two micropillars confines an optical mode such that these two optical modes have two different wavelengths; and
wherein said at least two micropillars emit laser light at different wavelengths.

11. The semiconductor device of claim 8,
wherein said array of micropillar semiconductor optoelectronic devices is fabricated on a single epitaxial wafer.

12. The semiconductor device of claim 8,
wherein said array of micropillar semiconductor optoelectronic devices is mounted on a single carrier material.

13. The micropillar semiconductor optoelectronic device of claim 1, further comprising:
vi) a means for heat dissipation from said gain medium.

14. The semiconductor device of claim 13,
wherein said means for heat dissipation from said gain medium further comprises galvanic gold mounted on said least one contact placed on said sidewall of said micropillar.

15. The semiconductor device of claim 13,
wherein said means for heat dissipation from said gain medium further comprises a dielectric deposited on said side wall of said micropillar.

16. The semiconductor device of claim 15,
wherein said dielectric deposited on said side wall of said micropillar has a heat conductivity at room temperature larger than two Watt per meter per Kelvin.

17. The micropillar semiconductor optoelectronic device of claim 15, further comprising
vii) a substrate.

18. A semiconductor optoelectronic device comprising
i) at least one cavity;
ii) at least one multilayer interference reflector,
iii) an n-doped semiconductor section, and
a p-doped semiconductor section, and
a p-n junction sandwiched between said n-doped semiconductor section and said p-doped semiconductor section,
iv) a gain medium placed within said p-n junction, and
v) at least two electric contacts,
further comprising at least one n-contact and at least one p-contact,
vi) an aperture,
wherein said at least one multilayer interference reflector has lateral dimensions smaller than twenty micrometers;
wherein said aperture has a lateral dimension,
wherein said lateral dimension of said aperture is smaller than five micrometers;
wherein said aperture is fabricated using a method selected from the group of the methods consisting of:
A) selective oxidation of at least one AlAs-rich layer,
wherein said at least one AlAs-rich layer is selected from the group consisting of:
I) a layer of binary AlAs, and
II) a layer of a Ga(1−x)Al(x)As alloy,
wherein Aluminum content (x) in said Ga(1−x)Al(x)As alloy exceeds ninety-three percent;
B) selective oxidation as in A) followed by oxide removal and formation of at least one air gap;
C) selective chemical etching; and
D) formation of a tunnel junction;
wherein said aperture provides current confinement; and
wherein said aperture provides optical confinement;
wherein said at least one multilayer interference reflector further comprises a sidewall;
wherein at least one contact of said at least two contacts is placed on said sidewall of said multilayer interference reflector overlapping with said at least one doped semiconductor section.

* * * * *